United States Patent

Yoshida et al.

[11] Patent Number: 5,853,471
[45] Date of Patent: Dec. 29, 1998

[54] COMPOSITION FOR ANTI-REFLECTION COATING

[75] Inventors: Takeo Yoshida; Hatsuyuki Tanaka, both of Shizuoka, Japan

[73] Assignee: Hoechst Japan Limited, Tokyo, Japan

[21] Appl. No.: 838,665

[22] Filed: Apr. 9, 1997

[30] Foreign Application Priority Data

Apr. 25, 1996 [JP] Japan ..................................... 8-129056

[51] Int. Cl.$^6$ ............................... C09D 5/33; G03C 1/73
[52] U.S. Cl. ................ 106/287.13; 106/287.14; 106/287.15; 106/287.23; 106/287.28; 106/287.3; 106/287.32; 252/582; 359/580; 430/270.1; 430/273.1
[58] Field of Search ......................... 106/287.13, 287.14, 106/287.15, 287.23, 287.28, 287.3, 287.32; 359/580; 252/582; 430/270.1, 273.1

[56] References Cited

U.S. PATENT DOCUMENTS

| | | | |
|---|---|---|---|
| 4,411,703 | 10/1983 | Whitehouse | 106/287.19 |
| 4,496,398 | 1/1985 | Whitehouse | 427/427 |
| 4,830,879 | 5/1989 | Debsikdar | 427/162 |
| 5,476,717 | 12/1995 | Floch | 428/421 |
| 5,514,526 | 5/1996 | Nishi et al. | 430/325 |
| 5,580,819 | 12/1996 | Li et al. | 427/167 |
| 5,585,186 | 12/1996 | Scholz et al. | 428/412 |
| 5,597,408 | 1/1997 | Choi | 106/481 |
| 5,611,850 | 3/1997 | Nishi et al. | 106/287.26 |
| 5,631,314 | 5/1997 | Wakiya et al. | 524/165 |

FOREIGN PATENT DOCUMENTS

| | | |
|---|---|---|
| 187303 | 7/1986 | European Pat. Off. . |
| 0 522 990 | 1/1993 | European Pat. Off. . |
| 2167876 | 6/1986 | United Kingdom . |

OTHER PUBLICATIONS

Chemical Abstract No. 123:273678 which is an abstract of Japanese Patent Specification No. 07–181685 (Jul. 1995).

Chemical Abstract No. 126:110857 which is an abstract of Japanese Patent Specification No. 08–305032 (Nov. 1996).

Chemical Abstract No. 126:270391 which is an abstract of Japanese Patent Specification No. 09–050129 (Feb. 1997).

JAPIO Patent Abstract No. JP402000671A which is an abstract of Japanese Patent Specification No. 02–000671 (Jan. 1990).

JAPIO Patent Abstract No. JP406200209A which is an abstract of Japanese Patent Specification No. 06–200209 (Jul. 1994).

Abstract of JP 9–69120, Appl. No. 4–221444, Date. (Mar.) 1994.

Abstract of JP 6–148896, Appl. No. 4–327610, Date. (May) 1994.

Patent Abstracts of Japan, JP 8–305032, Appl. No. 7–131096, Date. (Nov.) 1996.

*Primary Examiner*—Anthony Green
*Attorney, Agent, or Firm*—Foley & Lardner

[57] ABSTRACT

Disclosed herein is a composition for anti-reflection coating which comprises a perfluoroalkyl sulfonic acid, an organic amine, a polyvinyl pyrrolidone, a water-soluble alkylsiloxane polymer, and water. The composition is able to be an anti-reflection coating film which has a low refractive index, reduces the degree of forming insoluble layer, and does not generate fine particles and minute crystalline matters in its surface layer.

20 Claims, No Drawings

COMPOSITION FOR ANTI-REFLECTION COATING

BACKGROUND OF THE INVENTION

1. Field of the Invention

The present invention relates to a composition for anti-reflection coating. This composition is used to form an anti-reflection coating film on a resist film in order to prevent the accuracy of pattern dimensions from decreasing (or to prevent the pattern width from fluctuating) due to in-resist interference with reflected light from the substrate at the time of patterning by photolithography using a photoresist.

2. Description of the Prior Art

Semiconductor devices are usually produced by photolithography which involves the steps of coating a substrate (such as silicon wafer) with a photoresist film and patterning it by selective irradiation with active rays and subsequent development.

It is known that the pattern formed by selective irradiation with active rays fluctuates in its width due to interference. Much has been studied to minimize this fluctuation, as disclosed in Japanese Patent Laid-open Nos. 188598/1993, 69120/1994, and 148896/1994.

The first one is concerned with a composition for anti-reflection coating to be formed on a photoresist film. According to the disclosure, this composition consists of a water-soluble polymer binder and a water-soluble fluorocarbon compound (such as perfluorocarboxylic acid and quaternary ammonium salt of perfluorosulfonic acid). It is reported that this composition makes a transparent film having a refractive index of 1.401, which when applied to photolithographic process, reduces the fluctuation-of sensitivity caused by the variation of photoresist film thickness more effectively than in the case where no anti-reflection coating film is used. It is asserted that the fluctuation of sensitivity is due to multiple interference of light in the resist film and the anti-reflection film should ideally have a refractive index of $\sqrt{N_{resist}}=1.28$ to $1.30$.

The second disclosure is concerned with a process of forming an accurate size resist pattern by coating a substrate with a positive photoresist composed of novolak resin and naphthoquinonediazide and an alkaline anti-reflection film sequentially. This anti-reflection film contains a water-soluble polymer (such as polyvinyl alcohol, polyacrylic acid, and polyvinylamine) and is adjusted to approximately pH 10 with an organic alkali (such as tetramethylammonium hydroxide). The refractive index of anti-reflection coating is adjusted to desirable value by adding fluorine-containing polymer or fluorine-containing surfactant.

The effect of forming the anti-reflection film on the positive photoresist is that the organic alkali contained in the former catalyzes the crosslinking reaction between the novolak resin and naphthoquinonediazide contained in the latter, thereby converting its surface into an insoluble layer. This insoluble layer prevents the positive photoresist film from wearing out. In addition, because of using the ARCOR process, the disclosed process can make a resist pattern having stable dimensions.

The third disclosure is concerned with a coating solution for resist film which contains a water-soluble film-forming component and a fluorine-based surfactant and also concerned with a process of forming a resist pattern with high dimensional accuracy by coating the surface of the resist film with said coating solution for anti-reflective film. The water-soluble film-forming component includes, for example, polyvinyl pyrrolidone and water-soluble acrylic polymer having no hydroxyl groups in the molecule, and the fluorine-based surfactant includes, for example, perfluorocarboxylic acid, perfluorosulfonic acid, and quaternary ammonium salts thereof.

Unfortunately, in the first disclosure, when anti-reflection film is coated on a resist film, the upper portion of resist pattern (or insoluble layer) to be developed sometimes remains after developing. Presumably, this phenomena is caused by reacting mutually between novolak resin and naphthoquinonediazide in the presence of quaternary ammonium salt and being insoluble against developing solution at the surface of the pattern. In addition, the mentioned anti-reflection coating film has a refractive index which is far from the ideal one.

In the second disclosure, there is a disadvantage that the anti-reflection film can be applied only to the positive photoresist containing novolak resin and naphthoquinonediazide.

The third disclosure suffers the disadvantage that perfluorocarboxylic acid ($R_fCOOH$) is water-insoluble when used alone (i.e., it becomes water-soluble only in the presence of a base), and that quaternary ammonium salts of perfluorocarboxylic acid or perfluorosulfonic acid ($R_fCOOM$, $R_fSO_3M$ respectively) forms an insoluble layer on the resist surface.

OBJECT AND SUMMARY OF THE INVENTION

The present invention was completed to solve the above-mentioned problems. Accordingly, it is an object of the present invention to provide a composition for anti-reflection coating which is used to form an anti-interference film of good quality on the photoresist film.

DETAILED DESCRIPTION OF THE INVENTION

The present inventors have been studying the coating solution for anti-reflection and have recently reported a new composition for anti-reflection coating which is composed mainly of a perfluoroalkyl carboxylic acid and an organic amine. (Japanese Patent Application No. Hei-7 131096 filed on May 1, 1995) Their subsequent studies have revealed that this composition has the disadvantage of shrinking the thickness of the resist film at the baking step after its application to the resist film. It was found that the degree of shrinkage depends greatly on the baking temperature and baking time. A probable reason for this is that the bond strength between perfluoroalkyl carboxylic acid (as a weak acid) and organic amine (as a weak base) is so weak that it is broken by the thermal energy of baking treatment, with the result that part of these components evaporates.

In view of the foregoing, the present inventors made an anti-reflection film on an experimental basis by using perfluoroalkyl sulfonic acid (as a strong acid) in place of perfluoroalkyl carboxylic acid. It shrank very little upon baking unlike the anti-reflection film containing perfluoroalkylcarboxylic acid and organic amine. In addition, it was found to have a lower refractive index for light in the short wavelength region (436–248 nm) compared with the composition containing perfluoroalkylcarboxylic acid, organic amine, and water-soluble polymer. These findings led to the present invention.

The present invention covers:

(1) A composition for anti-reflection coating which comprises a perfluoroalkyl sulfonic acid, an organic amine, a polyvinyl pyrrolidone, a water-soluble alkylsiloxane polymer, and water.

(2) A composition for anti-reflection coating as defined in (1) above, wherein the perfluoroalkyl sulfonic acid is a compound represented by the formula (I) below.

$$C_nF_{2n+1}SO_3H \text{ (where } n=5-10) \tag{I}$$

(3) A composition for anti-reflection coating as defined in (1) above, wherein the organic amine is monoethanolamine.

(4) A composition for anti-reflection coating as defined in (1) above, wherein the polyvinyl pyrrolidone is one which has a molecular weight of 1000–10000, preferably 2000–5000.

(5) A composition for anti-reflection coating as defined in (1) above, wherein the water-soluble alkylsiloxane polymer is a compound represented by the formula (II) below.

$$\begin{array}{c} R^1 \\ | \\ R^2-(SiO)_{n'}-R^4 \\ | \\ R^3 \end{array} \tag{II}$$

(where $R^1$, $R^2$, $R^3$, and $R^4$ are identical or different, each denoting —H, —OH, —CH$_3$, or —O(CH$_2$CH$_2$O)$_m$H (m=1–20), and n' denotes an integer of 1 to 10.)

(6) A composition for anti-reflection coating as defined in (1) above, which contains 2–7 parts by weight, preferably 3–6 pbw of perfluoroalkyl sulfonic acid, 0.2–1 pbw, preferably 0.2–0.6 pbw of organic amine, 1 pbw of polyvinyl pyrrolidone, 0.001–0.10 pbw, preferably 0.01–0.08 pbw of water-soluble alkylsiloxane polymer, and 50–100 pbw of water.

(7) A composition for anti-reflection coating as defined in (6) above, which contains polyvinyl pyrrolidone and perfluoroalkyl sulfonic acid in a weight ratio of 1:3–1:5 and polyvinyl pyrrolidone and organic amine in a weight ratio of 1:0.3–1:0.5.

(8) A composition for anti-reflection coating as defined in (6) above, wherein the water-soluble alkylsiloxane polymer accounts for 0.001–0.5 wt % of the total amount of the composition.

The invention will be described in more detail in the following.

The composition of the present invention contains perfluoroalkyl sulfonic acid as a component, which is represented by the formula (I)

$$C_nF_{2n+1}SO_3H \text{ (where } n=5-010) \tag{I}$$

Specifically, the one represented by $C_8F_{17}SO_3H$ is preferable.

It functions as an active agent and is insoluble in water but becomes soluble in the presence of a basic substance.

The composition of the present invention contains polyvinyl pyrrolidone as another component, which functions as a water-soluble polymeric binder. Its characteristic properties required are:

(i) Good coating performance when the composition of the present invention is coated by means of spin coating method.

(ii) Good compatibility with fluorine-based surfactant.

(iii) High solubility in water after baking at high temperature (about 150°–160° C.).

(iv) Low refractive index.

According to the present invention, the polyvinyl pyrrolidone is one which has a molecular weight of 1000–10000, preferably 2000–5000. With a molecular weight smaller than 1000, it is difficult to obtain a uniformity of the film quality. With a molecular weight greater than 10000, the composition is liable to string at the time of spin coating, or give rise to a poor coating film.

With respect to the ratio of perfluoroalkyl sulfonic acid/polyvinyl pyrrolidone, the more this ratio raises, the lower the refractive index shows. In case of high ratio, the resulting coating film has an advantage as an anti-reflection coating because of low refractive index. On the other hand, perfluoroalkyl sulfonic acid in an excess amount against polyvinyl pyrrolidone produces adverse effect on the coating film, such as surface roughening, occurrence of crack-like patterns, increasing particles on the surface with time after film forming, and precipitation of crystalline materials with time after film forming.

It was found that the former two phenomena described above are related closely with the ratio between perfluoroalkyl sulfonic acid and organic amine, and the latter two phenomena can be avoided by using an additive.

The ratio between perfluoroalkyl sulfonic acid and organic amine varies, the effect is shown in Table 1. Only if the ratio of the two components is within the area surrounded by the thick line, it is possible to obtain good results (less surface roughening, less cracking, less particles, and less precipitation).

However, the optimization of composition alone is not enough to sufficiently suppress the occurrence of particles and precipitates if the amount of perfluoroalkyl sulfonic acid increases. This situation can be avoided by using an additive which is a derivative of lactose or xylose. Unfortunately, this additive is not desirable for the anti-reflection film because it increases the refractive index of the anti-reflection film. After their extensive studies, the present inventors found that it is possible to make an anti-reflection film free from particles and precipitates, without increase in refractive index, by adding a water-soluble alkylsiloxane polymer to the composition.

Perfluoroalkyl sulfonic acid differs from perfluoroalkyl carboxylic acid in that the composition containing the former has a higher contact angle when said composition is dropped on the resist film than the composition containing the latter. The composition with high contact angle against a resist film sometimes prevents easy coating of the composition to a certain kind of resist. A countermeasure to this trouble is to incorporate the composition with alcohol in an amount not to give damage to the resist film. Alcohol reduces the contact angle on the resist film and helps to form a uniform coating film.

The water-soluble alkylsiloxane polymer used in the present invention is commercially available under the trade name of "Polyflow-KL-245" (from Kyoeisha Yushi Co., Ltd.), which is represented by the formula (II). It is incorporated into the composition in an amount of 0.001–0.10 pbw, preferably 0.01–0.08 pbw, based on 1 pbw of polyvinyl pyrrolidone. With an amount less than 0.001 pbw, it does not show its desired effect. With an amount in excess of 0.10pbw, it will be liable to precipitate.

$$\begin{array}{c} R^1 \\ | \\ R^2-(SiO)_{n'}-R^4 \\ | \\ R^3 \end{array} \tag{II}$$

As mentioned above, perfluoroalkyl sulfonic acid dissolves in the presence of a basic substance. The basic substance used in the present invention is an organic amine, preferably alkanolamine, more preferably monoethanolamine.

The composition of the present invention is able to make a uniform, stable film having a low refractive index owing to the combination of perfluoroalkyl sulfonic acid, polyvinyl pyrrolidone, organic amine, water-soluble alkylsiloxane polymer, and water. This solution film does not form insoluble layer on the resist film.

Any amount of water can be added to this composition, but the amount of water should preferably be 50–100 pbw for 1 pbw of polyvinyl pyrrolidone. Purified water (or ion exchanged water) is desirable.

EXAMPLES

The invention will be described in more detail with reference to the following examples and comparative examples, which are not intended to restrict the scope of the invention. Parts in examples are based on weight.

Example 1

1 part of polyvinyl pyrrolidone having a molecular weight of 3000, 4 parts of perfluorooctane sulfonic acid, 0.35 part of 2-aminoethanol, and 0.004 part of "Polyflow-KL-245" (as water-soluble alkylsiloxane polymer) were mixed and dissolved with 94.646 parts of water. Then the solution was passed through a filter with a pore size of 0.05 $\mu$m. Thus filtrated solution was obtained as a composition for anti-reflection coating.

A 4-inch silicon wafer was coated with a positive photoresist ("AZ-7800" from Hoechst), ranging in thickness from 1.0 to 1.5 $\mu$m in increments of about 100 Å. Then the anti-reflection coating solution mentioned above was coated which thickness was about 650 Å on a resist-coated wafer.

The anti-reflection coating underwent baking at 90° C. for 90 seconds, exposuring by means of an i-line ($\lambda$=365 nm) stepper, baking at 110° C. for 90 seconds, and developing with TMAH developer (2.38%) for 60 seconds in this order. Each sample (varying in thickness) was examined for sensitivity.

It was found that the variation in sensitivity caused by standing wave is less in the sample with anti-reflection coating than in the sample without anti-reflection coating, with the ratio being approximately 23 to 100.

It was also found that the anti-reflection coating film has a refractive index of 1.395 for light having wavelength 365 nm. Change such as occurrence of crystalline materials and degrading did not occur in the anti-reflection coating film with lapse of time (more than 7 days after its preparation).

Example 2

A composition for anti-reflection coating was prepared by adding 5 parts of isopropyl alcohol to 100 parts of the anti-reflection coating solution described in Example 1. The resulting composition was applied on the photoresist film in the same manner as in Example 1. The anti-reflection coating film was examined for coating performance and the dependence of variation in sensitivity on the resist thickness.

It was found that adding isopropyl alcohol to the anti-reflection solution improves the coating performance (or improves the wettability of the anti-reflection solution on the resist film), thereby reducing the contact angle. It was also found that the anti-reflection coating film has a refractive index of 1.392 for light having wavelength 365 nm. No change occurred in the anti-reflection coating film with lapse of time (more than 7 days after its preparation). The dependence of variation in sensitivity on the resist thickness was similar to that in Example 1 (with the ratio being 24 to 100).

Comparative Example 1

The same procedure as in Example 1 was repeated except that "Polyflow-KL-245" (as water-soluble alkylsiloxane polymer) was omitted. It was also found that the anti-reflection coating film has a refractive index of 1.392 for light having wavelength 365 nm. The dependence of variation in sensitivity on the resist thickness was similar to that in Example 1 (with the ratio being 24 to 100). However, crystalline matters occurred in the anti-reflection coating film 2 days after its preparation.

Example 3

Several compositions were prepared with the amount of "Polyflow-KL-245" fixed at 0.005 part and the amounts of monoethanolamine (MEA) and perfluorooctane sulfonic acid ($C_8F_{17}$ $SO_3H$) changed relative to the amount of polyvinyl pyrrolidone (PVP), which is 1 part, as shown in Table 1. The samples were tested in the same manner as in Example 1. The results are shown in Table 1.

TABLE 1

| Amount of MEA (parts) | Amount of perfluorooctane sulfonic acid (parts) | | | | | | |
|---|---|---|---|---|---|---|---|
| | 3 | 3.5 | 4 | 4.5 | 5 | 5.5 | 6 |
| 0.2 | 1.399 / 32 / good | 1.393 / 32 / good | 1.388 / 30 / fair | 1.384 / 28 / bad | 1.379 / 25 / bad | 1.375 / 25 / bad | 1.371 / 24 / bad |
| 0.25 | 1.4 / 35 / good | 1.395 / 34 / good | 1.389 / 30 / good | 1.385 / 29 / fair | 1.382 / 27 / bad | 1.375 / 25 / bad | 1.373 / 24 / bad |
| 0.3 | 1.403 / 38 / good | 1.398 / 35 / good | 1.392 / 31 / good | 1.388 / 30 / good | 1.383 / 27 / fair | 1.379 / 25 / bad | 1.377 / — / bad |
| 0.35 | 1.405 / 38 / good | 1.398 / 36 / good | 1.393 / 33 / good | 1.390 / 31 / good | 1.385 / 28 / good | 1.380 / 26 / bad | 1.379 / — / bad |
| 0.4 | 1.406 / 39 / good | 1.401 / 39 / good | 1.394 / 35 / good | 1.391 / 31 / good | 1.387 / 29 / good | 1.384 / 28 / fair | 1.382 / — / bad |
| 0.45 | 1.408 / 39 / good | 1.405 / 40 / good | 1.397 / 37 / good | 1.394 / 34 / good | 1.392 / 30 / good | 1.388 / 28 / good | 1.386 / — / bad |
| 0.5 | 1.409 / 39 / fair | 1.404 / 40 / good | 1.399 / 38 / good | 1.396 / 35 / good | 1.395 / 33 / good | 1.390 / 30 / good | 1.388 / — / good |
| 0.55 | 1.411 / 40 / fair | 1.406 / 40 / fair | 1.402 / 38 / good | 1.399 / 38 / good | 1.399 / 36 / good | 1.393 / 32 / good | 1.391 / — / good |
| 0.6 | 1.413 / 43 / poor | 1.409 / 41 / poor | 1.405 / 40 / fair | 1.402 / 37 / fair | 1.401 / 38 / good | 1.396 / 34 / good | 1.393 / — / good |

Note to Table 1.
Top row: Refractive index
Middle row: Swing ratio (Variation in sensitivity in terms of ratio of the sample with anti-reflection coating to the sample without anti-reflection coating)
Bottom row: Rating of change with time
Rating of change with time:
Good   No change occurs at all on the film surface after film coating.
Fair   Film surface does not become rough and minute crystalline matters do not occur after film coating
Poor   Film surface tends to become rough with lapse of time after film coating althoug the performance remains unaffected.
Bad   Minute crystalline matters occur at the periphery of the film after film coating although the performance remains unaffected.

[Effect of the Invention]

The composition of the invention is able to be an anti-reflection coating film which has a low refractive index, reduces the degree of forming insoluble layer, and does not generate fine particles and minute crystalline matters in its surface layer. The composition of the invention has an enhanced performance.

What is claimed is:

1. An anti-reflection coating composition comprising:
   (a) from 2 to 7 parts by weight (pbw) of a perfluoroalkyl sulfonic acid;
   (b) from 0.2–1 pbw of an organic amine;
   (c) 1 pbw of a polyvinylpyrrolidone;
   (d) from 0.001–0.10 pbw of a water-soluble alkylsiloxane polymer; and
   (e) from 50 to 100 minus the total amount of components (a)–(d) pbw of water,
   wherein the parts by weight are based on 100 parts of (a) through (e).

2. An anti-reflection coating composition as claimed in claim 1, wherein the perfluoroalkyl sulfonic acid is a compound represented by the formula below:

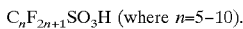

$C_nF_{2n+1}SO_3H$ (where $n$=5–10).

3. An anti-reflection coating composition as claimed in claim 1, wherein the organic amine is monoethanolamine.

4. An anti-reflection coating composition as claimed in claim 1, wherein the polyvinyl pyrrolidone is one which has a molecular weight of 1000–10000.

5. An anti-reflection coating composition as claimed in claim 1, wherein the water-soluble alkylsiloxane polymer is a compound represented by the formula below:

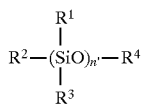

where $R^1$, $R^2$, $R^3$, and $R^4$ are identical or different, each denoting —H, —OH, —CH$_3$, or —O(CH$_2$CH$_2$O)$_m$H(m=1–20), and n' denotes an integer of 1 to 10.

6. An anti-reflection coating composition as claimed in claim 1, which contains polyvinyl pyrrolidone and perfluoroalkyl sulfonic acid in a weight ratio of 1:3–1:5 and polyvinyl pyrrolidone and organic amine in a weight ratio of 1:0.3–1:0.5.

7. An anti-reflection coating composition as claimed in claim 1, wherein the water-soluble alkylsiloxane polymer accounts for 0.001–0.5 wt % of the total amount of the composition.

8. An anti-reflection coating composition comprising:
   (a) from 3 to 5 parts by weight (pbw) of a perfluoroalkyl sulfonic acid;
   (b) from 0.2–0.6 pbw of an organic amine;
   (c) 1 pbw of a polyvinylpyrrolidone;
   (d) from 0.001–0.10 pbw of a water-soluble alkylsiloxane polymer; and
   (e) from 50 to 100 minus the total amount of components (a)–(d) pbw of water,
   wherein the parts by weight are based on 100 parts of (a) through (e).

9. An anti-reflection coating composition as claimed in claim 8, wherein the perfluoroalkyl sulfonic acid is a compound represented by the formula below:

$C_nF_{2n+1}SO_3H$ (where $n$=5–10).

10. An anti-reflection coating composition as claimed in claim 8, wherein the organic amine is monoethanolamine.

11. An anti-reflection coating composition as claimed in claim 8, wherein the polyvinyl pyrrolidone is one which has a molecular weight of 1000–10000.

12. An anti-reflection coating composition as claimed in claim 8, wherein the water-soluble alkylsiloxane polymer is a compound represented by the formula below:

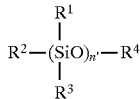

where $R^1$, $R^2$, $R^3$, and $R^4$ are identical or different, each denoting —H, —OH, —CH$_3$, or —O(CH$_2$CH$_2$O)$_m$H (m=1–20), and n' denotes an integer of 1 to 10.

13. An anti-reflection coating composition as claimed in claim 8, which contains polyvinyl pyrrolidone and perfluoroalkyl sulfonic acid in a weight ratio of 1:3–1:5 and polyvinyl pyrrolidone and organic amine in a weight ratio of 1:0.3–1:0.5.

14. An anti-reflection coating composition as claimed in claim 8, wherein the water-soluble alkylsiloxane polymer accounts for 0.001–0.5 wt % of the total amount of the composition.

15. An anti-reflection coating composition comprising:
   (a) a perfluoroalkyl sulfonic acid;
   (b) an organic amine;
   (c) a polyvinylpyrrolidone;
   (d) a water-soluble alkylsiloxane polymer; and
   (e) water,
   wherein the polyvinyl pyrrolidone and the perfluoroalkyl sulfonic acid are present in a weight ratio of 1:3–1:5 and the polyvinyl pyrrolidone and the organic amine are present in a weight ratio of 1:0.3–1:0.5.

16. An anti-reflection coating composition as claimed in claim 15, wherein the perfluoroalkyl sulfonic acid is a compound represented by the formula below:

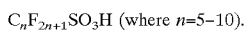

$C_nF_{2n+1}SO_3H$ (where $n$=5–10).

17. An anti-reflection coating composition as claimed in claim 15, wherein the organic amine is monoethanolamine.

18. An anti-reflection coating composition as claimed in claim 15, wherein the polyvinyl pyrrolidone is one which has a molecular weight of 1000–10000.

19. An anti-reflection coating composition as claimed in claim 15, wherein the water-soluble alkylsiloxane polymer is a compound represented by the formula below:

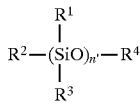

where $R^1$, $R^2$, $R^3$, and $R^4$ are identical or different, each denoting —H, —OH, —CH$_3$, or —O(CH$_2$CH$_2$O)$_m$H (m=1–20), and n' denotes an integer of 1 to 10.

20. An anti-reflection coating composition as claimed in claim 15, wherein the water-soluble alkylsiloxane polymer accounts for 0.001–0.5 wt % of the total amount of the composition.

* * * * *